United States Patent [19]
Pierrat

[11] Patent Number: 5,246,799
[45] Date of Patent: Sep. 21, 1993

[54] METHOD OF REMOVING EXCESS MATERIAL, FOR REPAIRING PHASE-SHIFTING LITHOGRAPHIC MASKS

[75] Inventor: Christophe Pierrat, Watchung, N.J.

[73] Assignee: AT&T Bell Laboratories, Murray Hill, N.J.

[21] Appl. No.: 763,046

[22] Filed: Sep. 20, 1991

[51] Int. Cl.$^5$ .............................................. G03F 9/00
[52] U.S. Cl. .......................................... 430/4; 430/5; 430/322
[58] Field of Search ................................ 430/4, 5, 322

[56] References Cited

U.S. PATENT DOCUMENTS 4,906,326  3/1990  Amemiya et al. ...................... 430/5
5,085,957  2/1992  Hosono ................................. 430/5

OTHER PUBLICATIONS

Cambria, T. D. et al., *Solid State Technology*, "Mask and Circuit Repair with Focused-Ion Beams", pp. 133–136, Sep. 1987.

*Primary Examiner*—Marion E. McCamish
*Assistant Examiner*—Mark A. Chapman
*Attorney, Agent, or Firm*—David I. Caplan

[57] ABSTRACT

A defect in the form of excess material, located in a trench region at a major surface of a phase-shifting mask, is removed by spinning on the major surface a planarization layer for which dry-etching conditions exist at which it anisotropically etches at the same rate as that of the excess material. Then the planarization layer is dry-etched under those conditions, using a patterned protective masking layer, such as chrome, having an aperture overlying the defect in the trench. This aperture need not be precisely laterally aligned with the defect (unless the defect extends to an edge of the trench). A plurality of such defects can be simultaneously removed. Likewise, defects located on plateau regions of the mask can be repaired.

20 Claims, 2 Drawing Sheets

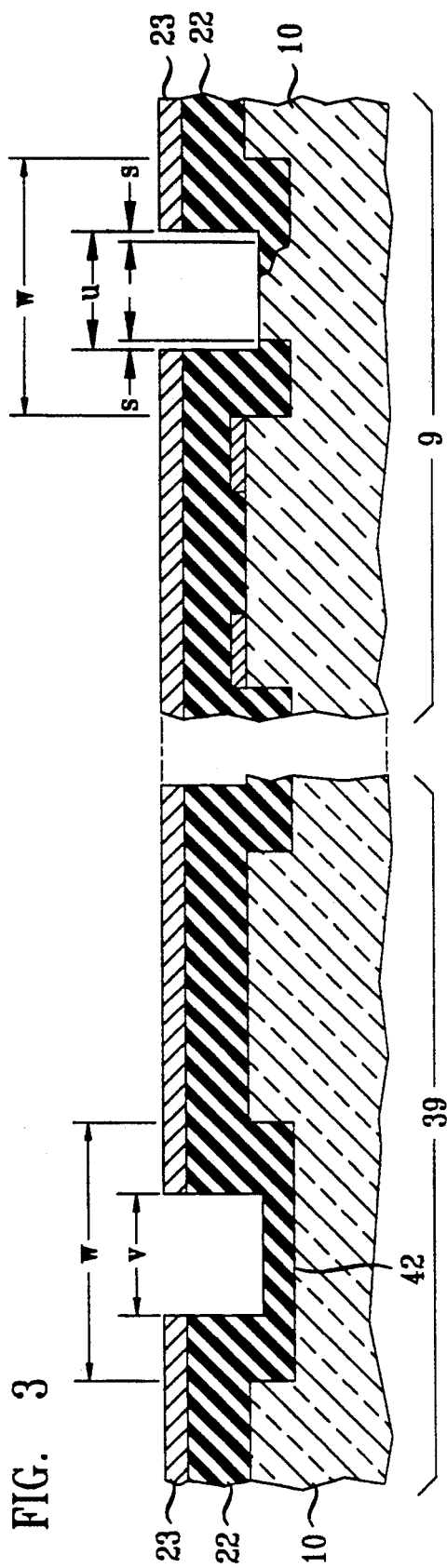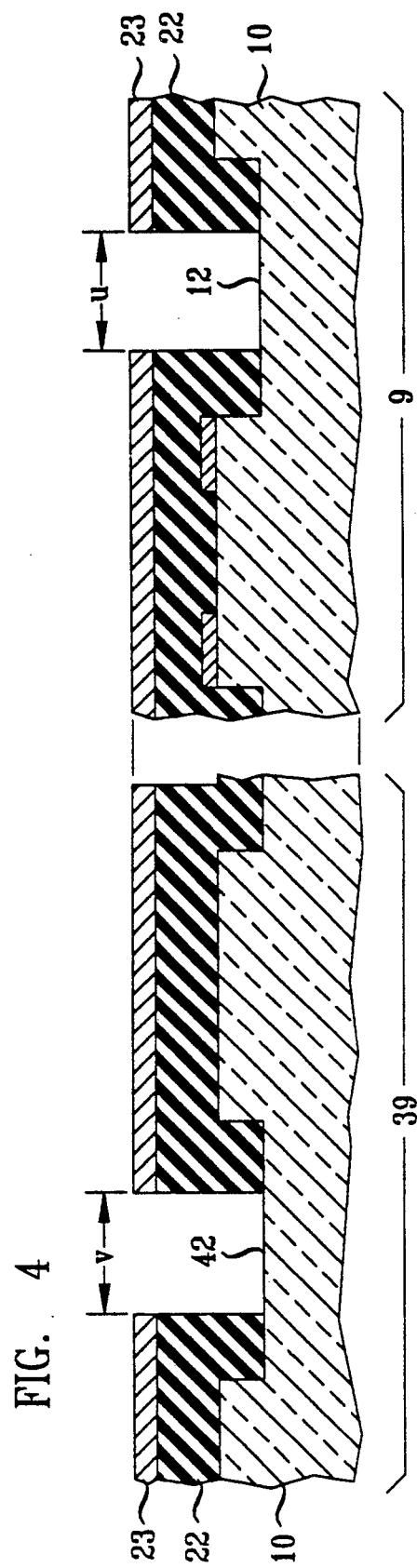

METHOD OF REMOVING EXCESS MATERIAL, FOR REPAIRING PHASE-SHIFTING LITHOGRAPHIC MASKS

TECHNICAL FIELD

This invention relates to optical lithography, and more particular to a method of repairing phase-shifting masks. Such masks typically are used in optical imaging systems for lithographically fabricating microminiature devices, such as semiconductor integrated circuits. These masks are also called "reticles," particularly when used in optical focusing systems having lateral magnifications that differ from unity.

BACKGROUND OF THE INVENTION

Lithographic masks have a pattern of features that are desired to be imparted into a workpiece, in order to fabricate, for example, semiconductor integrated circuits or other microminiature devices in the workpiece. Typically, the features of the mask are transferred to the workpiece by first placing the mask on the object plane of an optical imaging system that focuses optical radiation propagating through the mask, in order to transfer the features of the mask to a photoresist layer either overlying the workpiece or overlying a layer of material which overlies the workpiece. Then the photoresist layer is developed in order to form a patterned photoresist layer. Thus, the pattern of the mask features is transferred to the photoresist layer, with a magnification (greater to, equal to, or less than unity) that depends upon the design of the optical imaging system. The resulting pattern of the photoresist features is used to define features in the workpiece—such as edges of ion implant regions, edges of removed portions of the layer(s) of material overlying the workpiece to be removed, or edges of portions of the workpiece itself—all these edges thus being in accordance with the edges of the mask features.

A limiting factor in thus transferring the mask features to the photoresist layer is diffraction caused by the non-vanishing wavelength $\lambda$ (in the vacuum) of the optical radiation that is used in the optical imaging system. As a result of this diffraction, the edges of the images formed by the optical focusing system become less sharp than desired, whereby the resolution of the mask features when focused on the photoresist layer deteriorates. To improve this resolution, phase-shifting masks have been proposed. In these masks, the phases of the optical radiation propagating through the mask are shifted by, say, $\phi$ radian in some regions relative to others. For example, a typical portion 9 (FIG. 1) of a prior-art phase-shifting mask (hereinafter, "mask portion 9") has an opaque chrome (chromium) layer pair 13 located on a portion of the top substantially planar surface 14 of a raised (plateau) region 11 of a transparent, typically quartz, substrate 10. The region 11 is thicker, by a distance h, than an adjacent "trench" region having a width w. This trench region has a top surface 12 which is substantially planar except for the presence of excess material—typically quartz—forming an undesired defect region 21. As used herein, the term "substantially planar" refers to a situation in which any departures from planarity do not degrade, by more than desired amounts, the sharpness of images produced (e.g., in the photoresist layer) when the mask portion 9 is used in the optical imaging system.

The distance h corresponds to the optical phase shift $\phi$ (radian). Thus, $(hn)/\lambda - h\lambda = \phi$, or $h = \phi\lambda/(n-1)$, where n is the refractive index of the quartz. Typically, $\phi = \pi$ radian; so that typically, $h = \pi\lambda/(n-1)$. When viewed from above, the contours of the chrome layer pair 13 depend upon the contours of the ultimately desired features in the workpiece (or in a layer overlying the workpiece).

One problem that can arise in using the phase-shifting mask portion 9 is the presence of the above-mentioned defect region 21. It should be understood that, in general, the height of the defect region 21 can vary from point to point, typically anywhere between h and a tiny fraction of h, or even zero (as indicated in FIG. 1). This defect region 21 is typically composed of the same material as that of the substrate 10, typically quartz, that was not, but should have been, removed during whatever earlier processing was used to produce the trench region. Such a defect region can also be located in the plateau region 11.

Obviously, when the mask portion 9 is used in the optical imaging system, the presence of the defect region 21 can deteriorate the image formed by the mask portion 9 on the photoresist layer located on the workpiece. Rather than discard entirely this mask 9 having such a defect region 21 (the mask being otherwise very valuable) it is desirable to have a method of repairing the mask, i.e., a method of removing the defect region 21 without damaging the rest of the phase-shifting mask 9 (not shown). Such defect regions could be removed by techniques involving a three-dimensional inspection of the mask—for example, by means of a scanning tunneling electron microscope—followed by ion-assisted milling or laser-assisted milling of the defect region. Such ion-assisted milling (without the three-dimensional inspection required for repairing phase masks) has been described, for example, in "Mask and Circuit Repair with Focused-Ion Beams," by T.D. Cambria and N. P. Economou, published in *Solid State Technology*, pp. 133-136, September 1987. However, such techniques require careful three-dimensional point-by-point control of the milling in accordance with the varying height, from point to point, of the defect region 21. It would therefore be desirable to have a method for removing the defect region without necessitating three-dimensional inspection of the mask or three-dimensional control of the removal process.

SUMMARY OF THE INVENTION

In order to remove the excess material (e.g., quartz) that forms a defect region 21 located in a trench region, for example, and thereby repair the phase-shifting mask portion 9 (insofar as this defect region 21 is concerned), a planarization layer, such as a spun-on polymer layer, is formed on at least the entire width w of the trench region, and typically on the entire top surface of the mask (including all plateau and trench regions). This planarization layer advantageously has a substantially planar top surface, and it advantageously is selected such that there exist dry-etching conditions at which it etches, advantageously substantially anisotropically, at substantially the same rate as that of the material (e.g., quartz) that forms the defect region. As used herein the term "substantially" means that departures from perfection do not degrade, by more than desired amounts, the sharpness of images produced when the mask portion 9 is used in the optical imaging system. Then a protective layer, such as a chrome layer, is deposited on this planarization layer, the protective layer being supplied with an aperture which is laterally "aligned" with—i.e., which laterally overlies—the defect region.

The lateral extent of the defect region can have been determined by an earlier conventional two-dimensional scanning optical microscope inspection of the mask. The "alignment" of each such aperture with its underlying defect region need not be precise (unless the defect region extends to an edge of the trench region), so long as the aperture extends laterally everywhere farther than the defect region, advantageously by a safety margin, s. The planarization layer is substantially anisotropically etched (in the region where it underlies the aperture in the protective layer) until the etching process reaches the level of the top surface 12 of the trench region. At that point in time, the etching process is terminated (stopped). To determine this etch-stopping point in time, end-point etching at a dedicated place (which lacks a defect region) located on the mask can be used. Finally, the planarization layer is removed, typically by means of a wet solvent (whereby the protective layer overlying the planarization layer automatically is removed, or the protective layer can be independently removed first). In this way, a repaired phase-shifting mask is obtained—i.e., a mask from which the excess material in the defect region has been removed.

The reason that the surface of the trench region becomes substantially planar stems from the substantial equality of the etching rates of the planarization layer and of the excess (e.g., quartz) material.

In practicing this invention only two-dimensional (lateral) inspection of the mask—and not three-dimensional inspection—is thus required to ascertain the location and extent of each defect region. Moreover, only one-dimensional control (etch-stopping point detection) over the anisotropic etching is required. Also, the technique of this invention can similarly be used to remove excess material from regions other than the trench region, such as from the raised (plateau) region 11.

In case there is a plurality of defect regions, each typically (but not necessarily) located on the surface of a separate trench (or plateau) region, the technique of this invention can be used to remove the excess material simultaneously from all of the defect regions located in the trench regions (or in the plateau regions), simply by forming a plurality of apertures in the protective layer, each aperture overlying a separate defect region.

BRIEF DESCRIPTION OF THE DRAWING(S)

This invention, together with its features, characteristics, and advantages, may be better understood from the following detailed description when read in conjunction with the drawing in which:

FIGS. 2-5 are cross-section elevational views of various stages in a method of repairing the phase-shifting mask shown in FIG. 1 in accordance with a specific embodiment of the invention.

Only for the sake of clarity, none of the drawings is to any scale.

DETAILED DESCRIPTION

Figure 1:
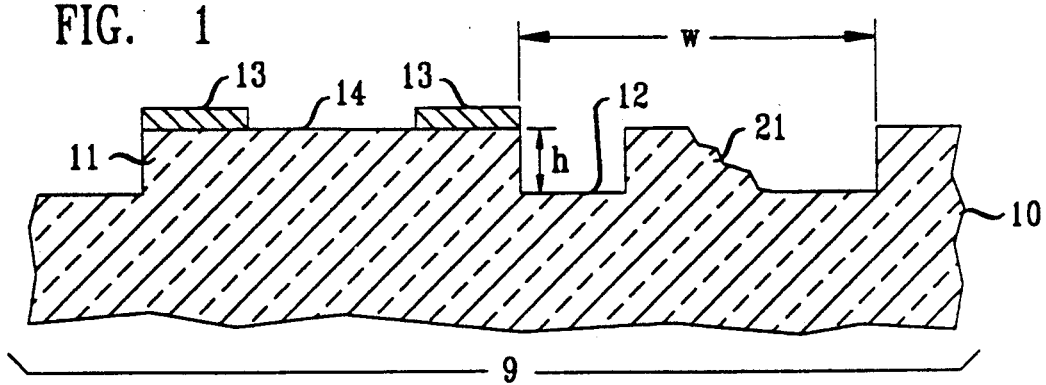
FIG. 1 is a cross-section elevational view of a portion of a prior-art phase-shifting mask to be repaired in accordance with a specific embodiment of the invention.
Figure 5:
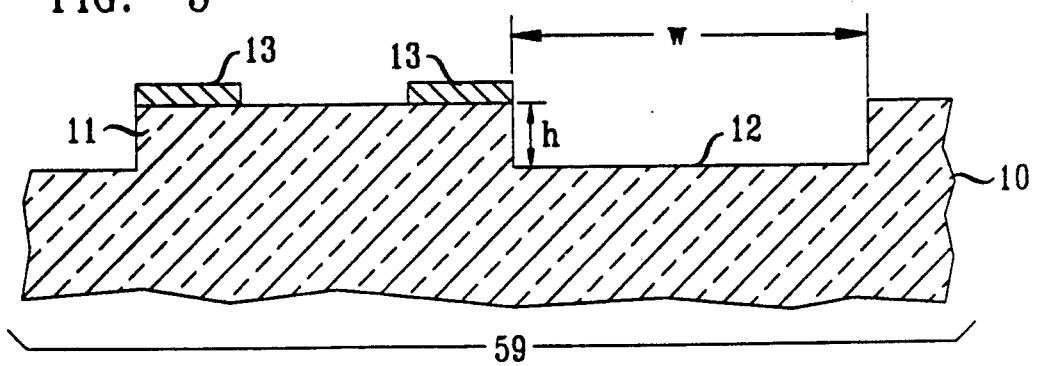

FIG. 1 depicts the phase-shifting mask portion 9 to be repaired and thus to form a repaired phase-shifting mask portion 59 (FIG. 5). The mask portion 9 includes a transparent essentially quartz substrate 10 having a raised plateau (thicker) region 11 with a top surface 14. As used herein, the term "essentially quartz" includes commercial grade quartz, viz., non-pure quartz as is commercially available. The substrate 10 also has a trench (thinner) region with a top surface 12 and a width w. The top surface 12 of the trench region is located at a depth h beneath the top surface 14 of the plateau region 11. A patterned opaque chromium layer pair 13 (hereinafter, simply "the chrome layer 13") is located on the top surface 14 of the plateau region 11. Typically, the depth h corresponds to a phase-shift of $\pi$ radians. The purpose of the chromium layer 13 is to supply an optically opaque portion for the phase-shifting mask portion 9, as known in the art.

The mask portion 9 has a defect region 21 illustratively composed of excess quartz material, and it is desired to remove this region 21 and thereby substantially everywhere planarize the top surface 12 of the trench region. This defect region 21 can have a variable height—i.e., a height that varies with lateral (two-dimensional) position along the surface 12, as indicated along a right-hand portion of the defect region 21 (FIG. 1).

The outermost lateral (two-dimensional) contours of the defect region are determined first, such as by an inspection with a two-dimensional scanning optical microscope.

Figure 2:
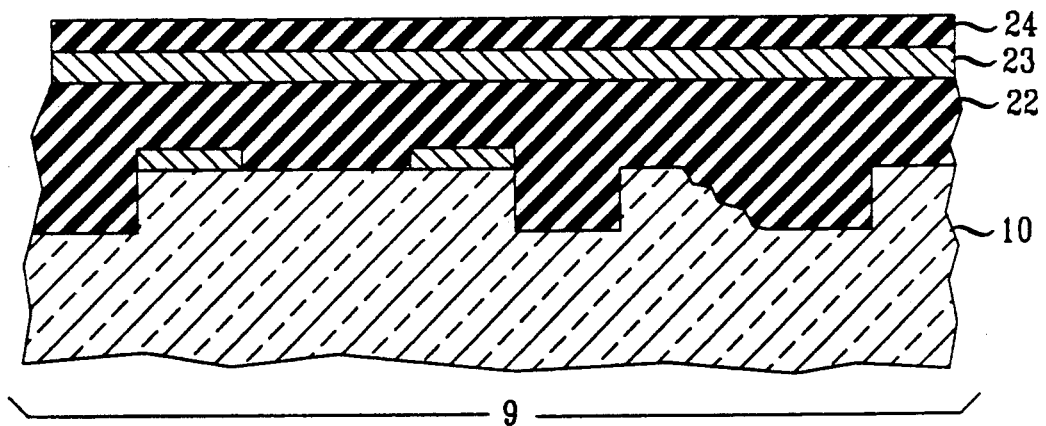

Referring now to FIG. 2, there are then successively formed on the top surface of the mask portion 9, as well as typically on the top surface of the rest of the mask (not shown), layers 22, 23, and 24. Layer 22 is a planarization layer, typically a spun-on, essentially polymer layer, such as a polycresolformaldehyde or a polyvinylphenol, as are commercially available. Advantageously this planarization layer possesses anisotropic etching conditions for which it etches at substantially the same rate as that of the excess (quartz) material. Layer 23 is essentially chromium (possibly intermixed with some chromium oxide or other impurities) having a uniform thickness typically equal to about 0.03 $\mu$m; and layer 24 is a positive or negative tone resist layer—preferably positive tone—having a uniform thickness equal to about 0.5 $\mu$m. The thickness of planarization layer 22 at areas overlying the surface 14 of the plateau region 11 is typically equal to about 1 $\mu$m.

The resist layer 24 is exposed to a patterned beam of actinic radiation (ion beam, photon beam, or electron beam), the two-dimensional contours of the pattern being substantially the same as those of the previously determined (outermost) two-dimensional contours of the defect region 21 plus a non-zero safety margin having a width equal to s. Thus this alignment of the contours of the actinic radiation with those of the defect region need not be precise, so long as there is any safety margin (provided that the defect region 21 does not extend to an edge of the trench region). The width s of this safety margin depends on the accuracy of the method used for ascertaining the (outermost) contours of the defect region 21, as well as depends on the width w of the trench region. Typically this width s is about 0.5 $\mu$m or less.

Next, the resist layer 24 is developed, typically by a wet development, whereby it becomes a patterned resist layer. This pattern of the thus patterned resist layer 24 is then transferred to the chromium layer 23, typically by means of a standard technique such as anisotropic dry etching with a gas mixture of $Cl_2$ and $O_2$. Alternatively, by virtue of the relatively small thickness of the chromium layer 23 with respect to undercut tolerance, isotropic wet etching—for example, with ceric ammonium nitrate solution—can also be used without inducing an unwanted undercut of the chrome features located underneath the resist features. The thus patterned chromium layer 23 will have an aperture of width equal to u overlying the defect region 21, with u being equal to the width of the defect region 21 plus twice the safety margin s.

Next, the top surface of the mask portion 9, together with a dedicated auxiliary portion 39 (shown in FIG. 3, but not shown in FIGS. 1, 2, and 5) of the mask which is being repaired is subjected to a substantially anisotropic dry etching procedure at which the planarization layer 22 and the defect region 21 etch at substantially equal rates. FIG. 3 shows an intermediate stage of this etching procedure. Typically, this etching procedure is implemented with gaseous $CF_4$, or gaseous $CHF_3$, or a gaseous mixture of both, or a gaseous mixture of either or both with $O_2$. As a result, the (patterned) resist layer 24 tends to be removed and therefore is not shown in FIG. 3.

The auxiliary portion 39 (FIG. 3) of the mask which is being repaired has an auxiliary trench region whose top surface 42 has a width that is advantageously equal to the width w of the trench region in the mask portion 9—in order to facilitate fabrication of substantially equal thicknesses of the portion of the planarization layer 22 overlying the trench region that is located in the auxiliary portion 39 and the portion of the planarization layer 22 overlying the trench region that is located in the mask portion 9. This equality of these thicknesses ensures proper etch-stopping functioning by the auxiliary mask portion 39.

As viewed from above, the auxiliary trench region typically has a contour in the form either of a square or of parallel lines. The aperture in the chromium layer 23 located in the auxiliary mask portion 39 has a width v that is advantageously equal to u. The purpose of the auxilairy trench region is to act as an etch stop (indicator), as more fully explained below.

Advantageously further, in order to enhance the intensity of the etch stop indication, there is a plurality of such auxiliary trench regions, such that the total surface area covered by the apertures (each of width v) in the auxiliary mask portion 39 is equal to approximately 1 cm$^2$. Advantageously, each of these auxiliary trench regions has the same width w as that of the trench region located in the mask portion 9. Moreover, these auxiliary trench regions advantageously are physically separated from one another and thus are not coalesced into a single trench region, in order that the thickness of the planarization layer 22 overlying the top surface 12 of trench region located in the mask portion 9 substanitally approximixates the thickness of the planarization layer 22 overlying the plurality of auxiliary trench regions, and hence again in order to ensure proper etch-stop functioning by the auxiliary mask portion 39.

The anisotropic etching of the planarization layer 22 thus forms cuts of widths u and v therein overlying the mask portion 9 and the auxiliary mask portion 39, respectively. This etching is terminated (FIG. 4) when a signal from the auxiliary trench region indicates that the anisotopic etching has progressed to the point that it has just reached the top surface 42 of the auxiliary trench region(s) located in the (now) cut auxiliary portion 49 and hence automatically also has just reached the top surface 12 of the trench region of the mask portion 9. This signal can be generated, for example, by detection of the light emitted in the plasma caused by radioactive transitions of decomposition products produced during the anisotropic etching and emanating only from the planarization layer 22 in the plurality of auxiliary trench regions.

Because of the substantial equality of etch rates of the planarization layer 22 and of the substrate 10, as well as the substantial equality of the thicknesses of the respective portions of this planarization layer that are located overlying the trench regions located in the mask portion 9 and in the auxiliary portion 39, this etching has removed the defect region 21, as is desired—that is, in such a way that the top surface 12 of the trench region is substantially planar, viz., with a depth everywhere equal to h.

Finally the remaining (remnants of the) planarization layer 22 can be removed, typically by means of a wet solvent, whereby the chromium layer 23 is also automatically removed (FIG. 5) and the desired repaired mask portion 59 is formed.

In case the excess material forms a defect region located on the plateau region 11, this defect region can be removed in the same way as described above, except that now the apertures in the planarization layer 22 will be located overlying both this defect region itself (plus the safety margin) and plateau regions located in the auxiliary portion 39.

In case there is a plurality of defect regions to be repaired, each defect region being located typically in a separate trench (or plateau) region, then the width u of a specific aperture overlying a specific defect region is still advantageously made equal to the width of the specific defect region plus twice the safety margin s. In the auxiliary portion 39, the widths v of the apertures in the chromium layer 23 and hence of the cuts in the planarization layer 22 then typically are all made equal to about 2 $\mu$m. Also, as viewed from above, the outer contours of these apertures and cuts in the auxiliary portion 39 are typically squares.

As an alternative to the above-described procedure, the planarization layer can be a polymer that is chosen such that it is sensitive to electron beam, ion beam, or photon (UV) beam radiation. By "sensitive" it is meant, for example, that upon exposure to an atmosphere of a vapor of an organometallic compound, such as an organoaluminum amide, the organometallic compound diffuses into the polymer and reacts with it to form an organometallic resist that is resistant to etching by fluorine-containing plasmas only in regions of the polymer that were not exposed to the radiation. The regions that are exposed to such radiation should overlie both the defect region and the portions of width v located in the auxiliary trench (or plateau) regions. In this way, and organometallic polymer that is etch-resistant to fluorine-containing plasmas is formed in those regions that overlie the complement of the defect region and the complement of the auxiliary trench (or plateau) regions. Thus the resist functions in a positive tone manner. Also, again the polymer is to be chosen such that in its exposed regions it will etch—typically, reactively ion etch with gaseous $CF_4$, or gaseous $CHF_3$, or a gaseous mixture of both, or a gaseous mixture of either or both with $O_2$—at the same rate as that of the excess material.

For example, in conjuction with a focused ion beam, the polymer can be a polycresolformaldehyde. This polymer resist will crosslink in regions thereof that have been exposed to a focused ion beam; and thus the diffusion of the organometallic compound in the previously exposed regions of the resist will be suppressed, and the reaction of the organometallic compound with the previously exposed regions of the resist will also be suppressed, whereby this polymer will behave as a positive tone resist.

As a further option, the polymer is chosen such that an etch-resistant organometallic resist is formed only in those regions that were exposed to the radiation, and these regions should overlie the complement both of the defect region and of the portions of width v located in the auxiliary trench (or plateau) regions. In this way, again an organometallic resist (that is resistant to etching by fluorine-containing plasmas) is formed in those regions that overlie the complement of the defect region and of the auxiliary trench (or plateau) regions—i.e., in a negative tone manner.

Although the invention has been described in detail with respect to specific embodiments, various modifications can be made without departing from the scope of the invention. For example, the chrome layer 23 can be omitted in case the resist layer 24 itself is sufficiently durable so as to be usable as a patterned resist during the anisotropic etching of the planarization layer 22. Instead of chrome, other materials having a good dry-etch resistance during the defect region etching can be used, for example aluminum having a thickness of about 0.03 μm, the aluminum being patterned typically by means of a gaseous chlorine plasma etching process. Instead of the aforementioned polymers, other materials can be used for the planarization layer 22, such as silicon dioxide or silicon nitride which have been chemically vapor deposited, or spun-on glass. Also, the chromium layer 23 can be removed, prior to removal of the planarization layer 22, by a known chromium etchant. Instead of quartz, the substrate can be essentially calcium fluoride or magnesium fluoride.

I claim:

1. A method of repairing a phase-shifting lithographic mask, the mask having a substrate, the substrate having a trench region and a plateau region each of which has a substantially planar top surface except in a defect region located in one of the trench or plateau regions where excess material is present, comprising the steps of
   (a) forming a first layer having a substantially planar surface overlying at least the one region, the first layer having a portion, overlying at least the lateral extent of the defect region, that is characterized by etching conditions at which it etches at substantially the same rate as that of the excess material; and
   (b) etching through the portion of the first layer at the etching conditions until the etching reaches the level of the top surface of the one region, whereby the excess material is removed, and whereby the entire surface of the one region is substantially planar.

2. The method of claim 1 in which prior to the etching, a second layer is formed on the top surface of the first layer, and an aperture is formed in the second layer overlying at least the entire lateral extent of the defect region, the second layer being resistant to the etching, whereby the aperture in the second layer defines the portion of the first layer.

3. The method of claim 2 in which the excess material has the same composition as that of the substrate.

4. The method of claim 2 further comprising the step of two-dimensionally inspecting the mask for the defect region.

5. The method of claim 2 in which the first layer is essentially a polymer.

6. The method of claim 5 in which the excess material has the same composition as that of the substrate.

7. The method of claim 2 in which the second layer comprises a layer of metal.

8. The method of claim 2 further comprising the step of removing the remnants of the first and second layers subsequent to step (b).

9. The method of claim 2 in which the composition is essentially quartz.

10. The method of claim 9 in which the first layer is essentially a polymer.

11. The method of claim 9 in which the excess material has the same composition as that of the substrate.

12. The method of claim 1 in which the second layer comprises a metal.

13. The method of claim 1 further comprising the step of two-dimensionally inspecting the mask for the defect region prior to step (a).

14. The method of claim 1 in which the excess material has the same composition as that of the substrate.

15. The method of claim 1 in which the first layer is essentially a polymer.

16. The method of claim 15 in which the excess material has the same composition as that of the substrate.

17. The method of claim 16 in which the composition is essentially quartz.

18. The method of claim 1 further comprising the step of removing the remnants of the first layer subsequent to step (b).

19. A photolithographic method including the steps of:
   (a) repairing a phase-shifting in accordance with the steps recited in claim 18;
   (b) directing the optical radiation onto the mask, and focusing the radiation propagating through the mask onto a photoresist layer located on a major surface of a wafer, or on a layer of material located on a major surface of a wafer;
   (c) developing the photoresist layer, whereby an edge feature is formed therein; and
   (d) defining a feature at the major surface of the wafer or in the layer of material, respectively, in accordance with the edge feature in the photoresist layer.

20. A photolithographic method including the steps of:
   (a) repairing a phase-shifting mask in accordance with the steps recited in claim 8;
   (b) directing the optical radiation onto the mask, and focusing the radiation propagating through the mask onto a photoresist layer located on a major surface of a wafer, or on a layer of material located on a major surface of a wafer;
   (c) developing the photoresist layer, whereby an edge feature is formed therein; and
   (d) defining a feature at the major surface of the wafer or in the layer of material, respectively, in accordance with the edge feature in the photoresist layer.

* * * * *